(12) United States Patent
Cellini et al.

(10) Patent No.: US 7,124,896 B2
(45) Date of Patent: Oct. 24, 2006

(54) EQUIPMENT TRAY

(75) Inventors: Richard L. Cellini, St. Michael, MN (US); Gregory W. Gleason, Stillwater, MN (US); Michael E. Smith, St. Bonifacius, MN (US)

(73) Assignee: Lockheed Martin Corporation, Eagan, MN (US)

( * ) Notice: Subject to any disclaimer, the term of this patent is extended or adjusted under 35 U.S.C. 154(b) by 555 days.

(21) Appl. No.: 10/278,281

(22) Filed: Oct. 23, 2002

(65) Prior Publication Data

US 2004/0079674 A1    Apr. 29, 2004

(51) Int. Cl.
  *A47F 7/00* (2006.01)
  *B65D 85/30* (2006.01)
  *B65D 85/00* (2006.01)

(52) U.S. Cl. .................................. 211/26; 206/723

(58) Field of Classification Search ................. 211/26, 211/126.1, 135, 133.6, 72, 84, 73, 126.16; 312/223.2, 330.1
See application file for complete search history.

(56) References Cited

U.S. PATENT DOCUMENTS

| | | | |
|---|---|---|---|
| 2,942,364 A * | 6/1960 | Horton .......................... 40/489 |
| 3,851,938 A * | 12/1974 | McCowan et al. ........... 312/117 |
| 4,527,707 A * | 7/1985 | Heymann et al. ............ 220/571 |
| 4,759,466 A * | 7/1988 | Chase et al. ................ 220/4.02 |
| 5,477,594 A * | 12/1995 | LePage ............................. 27/1 |
| 5,735,411 A * | 4/1998 | Flamme et al. ................ 211/26 |
| 5,951,134 A * | 9/1999 | Braun et al. .............. 312/405.1 |
| 6,059,386 A * | 5/2000 | Yu ........................... 312/223.2 |
| 6,293,637 B1 * | 9/2001 | Anderson et al. ......... 312/265.1 |
| 6,338,413 B1 * | 1/2002 | Walter et al. .................. 211/26 |
| 6,398,068 B1 * | 6/2002 | Geheniau ..................... 220/840 |
| 6,675,976 B1 * | 1/2004 | Steinman et al. .............. 211/26 |
| 6,749,070 B1 * | 6/2004 | Corbett et al. ................. 211/26 |
| 6,932,447 B1 * | 8/2005 | Chen et al. ............... 312/223.2 |
| 6,968,958 B1 * | 11/2005 | Lauchner et al. .............. 211/26 |
| 2004/0173544 A1* | 9/2004 | Chen ............................ 211/26 |

* cited by examiner

*Primary Examiner*—Jennifer E. Novosad
(74) *Attorney, Agent, or Firm*—Jacobson & Johnson

(57) ABSTRACT

An equipment tray of sheet metal having a base with a bottom section and a set of four sides integral to the bottom section with each of the four sides extending outward from the base to form a compartment therein and at least one of the sides having a beveled lip extending along a first portion of the side to provide stiffness to the base to avoid the "oil can effect" occurring with sheet metal trays. A further feature of the inventions is the inclusion of a cover retaining slot formed in the base by having a second portion of a side configured to coact with a beveled edge to form a cover retaining slot between the second portion of the side and the beveled edge to prevent lateral movement of the cover.

12 Claims, 4 Drawing Sheets

EQUIPMENT TRAY

FIELD OF THE INVENTION

This invention relates generally to equipment trays and more particularly to a two-part tray having a slot locked nested cover mounted thereto so as to inhibit rattling or vibration and a base that maintains its integrity under field conditions.

CROSS REFERENCE TO RELATED APPLICATIONS

None

STATEMENT REGARDING FEDERALLY SPONSORED RESEARCH OR DEVELOPMENT

None

REFERENCE TO A MICROFICHE APPENDIX

None

BACKGROUND OF THE INVENTION

The concept of equipment trays for holding electronic equipment in racks is well known in the art. Typically, such trays are of a standard size to enable the equipment tray to be used in a number of different applications. One of the difficulties with equipment trays is that the component parts of the trays may rattle or vibrate due to external forces. Another difficulty is that a tray may lack sufficient stiffness to prevent "oil canning" a process where the metal buckles in response to external forces on the tray.

The present invention provides an improved equipment tray that is resistant to "oil canning" and inhibits the rattling and vibration that occurs with prior art equipment trays through the use of a one piece base having integral sides that are secured to each other to form a multi-sided compartment and a cover that extends over the compartment with the cover including lips that are engaged in laminate like fashion between a beveled lip along a first portion of one side and a straight lip along another portion of the side to retain the cover from lateral displacement.

SUMMARY OF THE INVENTION

An equipment tray of sheet metal having a base with a bottom section and a set of four sides integral to the bottom section with each of the four sides extending outward from the base to form a compartment therein and at least one of the sides having a beveled lip extending along a first portion of the side to provide stiffness to the base to avoid the "oil can effect" occurring with sheet metal trays. A further feature of the invention is the inclusion of a cover-retaining slot formed in the base by having a portion of a side configured to coact with a beveled edge to form a cover retaining slot between a second portion of the side and the beveled edge to prevent lateral movement of the cover.

DESCRIPTION OF THE PREFERRED EMBODIMENT

Figure 1:
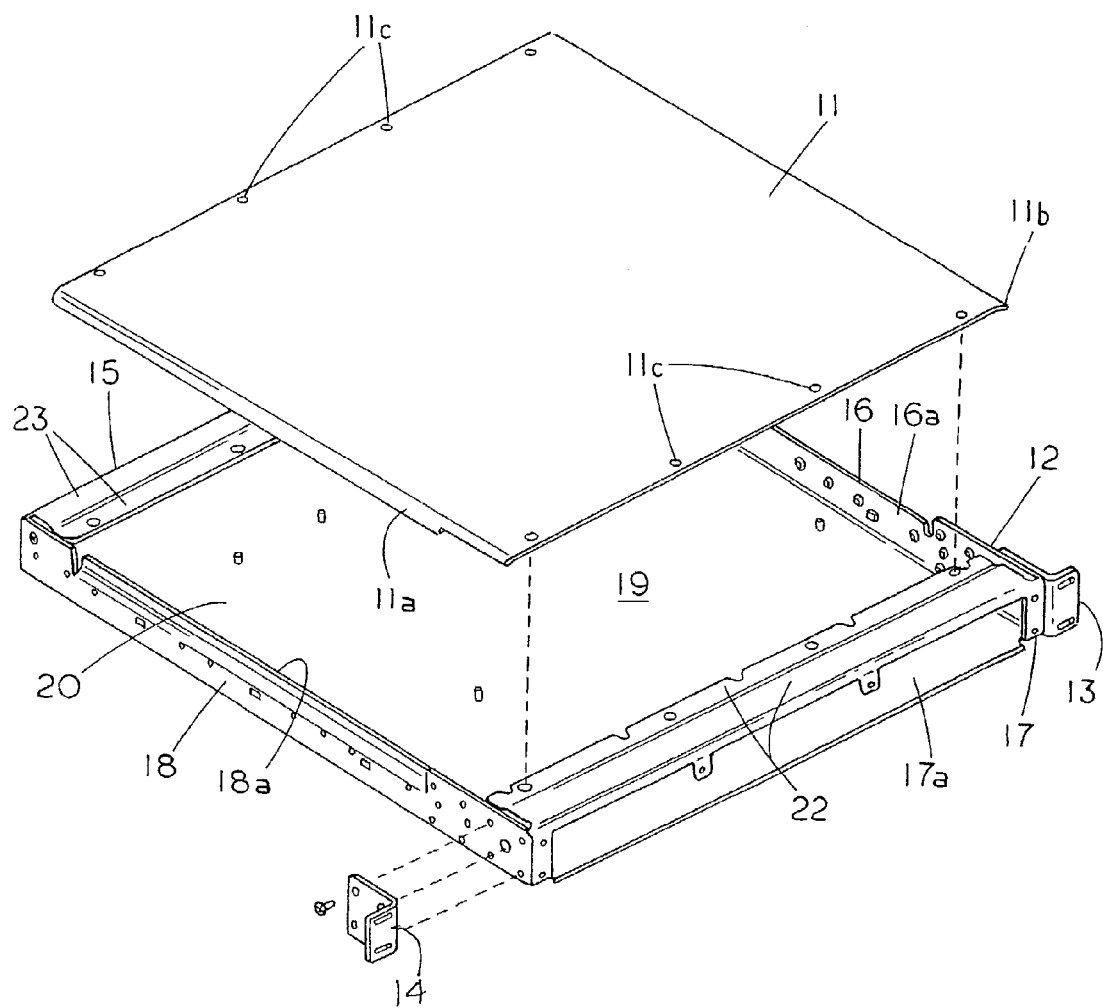
FIG. 1 is an exploded pictorial view of the equipment tray and cover of the present invention.

FIG. 1 is an exploded pictorial view of equipment tray 12 and cover 11 of the present invention showing side brackets 13 and 14, which are secured to opposite sides of tray 12, for supporting the equipment tray 12 in an equipment rack. Equipment tray 12 is formed from a single piece of sheet metal and includes fasteners to hold adjacent sides of the equipment tray in position to form a compartment 19 therebetween. As can be seen in FIG. 1 the equipment tray 12 includes a set of four sides 15, 16, 17 and 18 that extend upward from bottom section 20 to form a compartment 19 therebetween.

The front side 17 includes a beveled top flap 22 and the rear side 15 includes a similar beveled top flap 23. Each of the opposed sides include a portion thereof with a beveled lip. That is, side 18 includes a beveled lip 18a extending along a portion of side 18 with a further portion of side 18 free of any beveled lip. Similarly side 16 includes a beveled lip 16a extending along a portion of side 16 with a further portion of side 16 free of any beveled lip.

Cover 11 is shown in a spaced condition from tray 12 with cover 11 including a first lip 11a along one side of cover 11 and a second lip 11b along an opposite side of cover 11. A plurality of fastener holes 11c are spaced throughout cover 11 to enable securing of cover 11 to tray 12.

Figure 2:
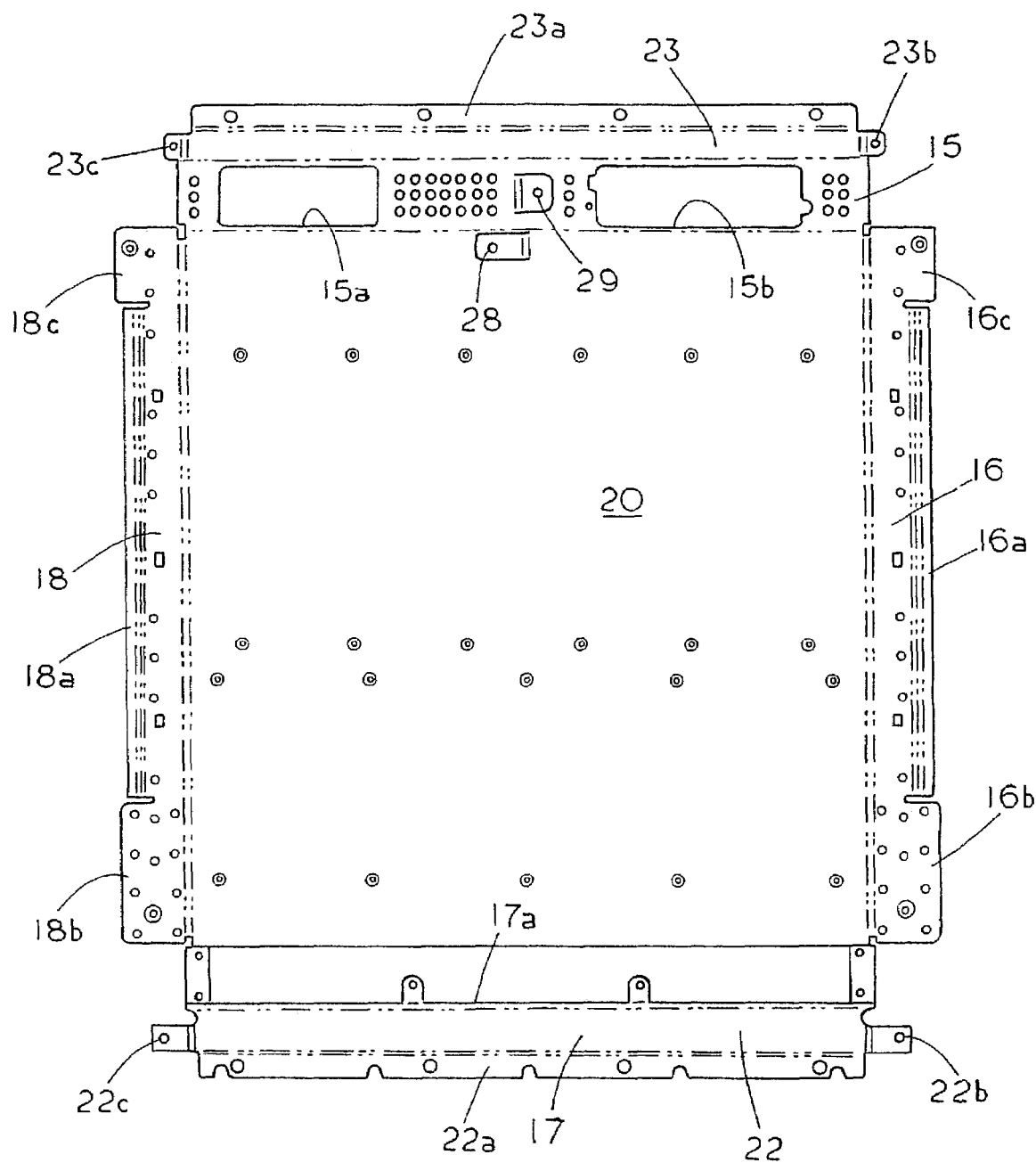
FIG. 2 is a plane view of the equipment tray in the prefolded condition.

FIG. 2 is a plane view of the one-piece equipment tray 12 in the prefolded condition. In the prefolded condition or unfolded condition tray 12 comprises a bottom section 20 with four outwardly extending sides 15, 16, 17 and 18 which are free of each other at their respective ends. In the embodiment shown, side 18 has a first portion having a beveled edge 18a for engaging one side of a cover lip 11a and a further portion 18b and 18c for engaging an opposite side of a cover lip 11a to hold the cover lip 11a in a retained or interlocking relationship therein. Similarly, side 16 has a first portion having a beveled edge 16a for engaging one side of cover lip 11b and a further portion 16b and 16c with for engaging an opposite side of a cover lip 11b to hold the cover lip 11b in a retained or interlocking relationship therein.

Front side 17 includes an opening 17a for providing access to equipment within the compartment 19. Front side 17 connects to a front flap 22 that extends in a side-to-side relationship across tray 12 with one end of flap 22 having an integral fastening tab 22c and the other end having an integral fastening tab 22b. Front flap 22 includes a beveled edge 22a which extends from end to end of front lip 22.

Rear side 15 includes a set of openings 15a and 15b for equipment access through connectors or the like. In addition extending along side 15 is a rear flap 23 having a tab 23c on one end and a tab 23b on the opposite end. Tab 23c and 23b enable the rear flap to be secured to adjacent sides by a fastener. In addition there are provided integral central tabs 28 and 29. When tab 28 is bent at a right angle to base bottom, 20 and tab 29 is bent at a right angle to side 15 a fastener can be secured through the openings in each of the tabs to provide further integrity to base 12. A beveled edge 23a extends along the outward edge of flap 23 to add stiffening to the tray and to provide a recess for receiving the cover 11.

Figure 3:
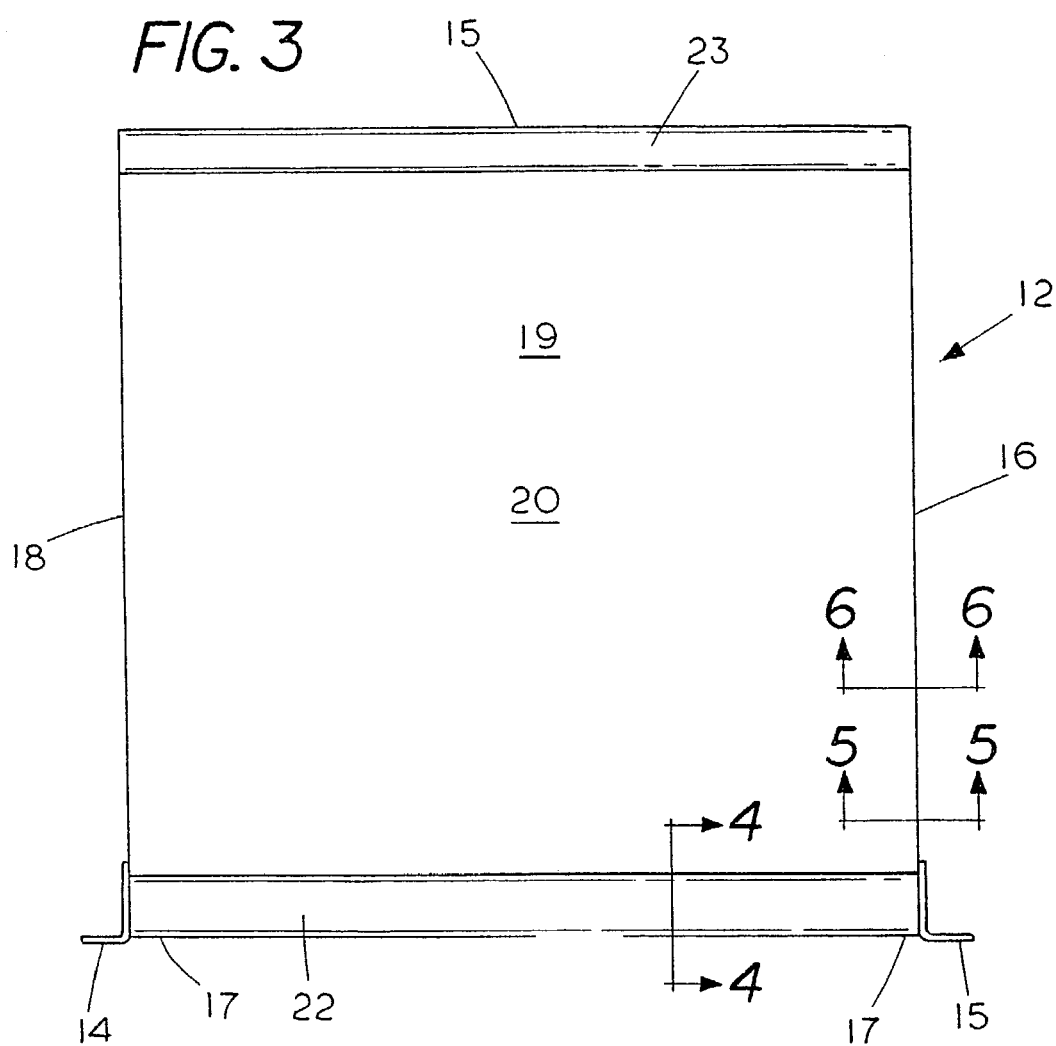
FIG. 3 shows the equipment tray in the folded condition.

In order to show tray 12 in the folded condition reference should be made to FIG. 3 which shows a top view of tray 12 in the folded condition. In the folded condition the sides 16 and 18 extend substantially perpendicular from bottom 12 as do sides 15 and 17 to form a rectangular shaped compartment 19 therein. In this condition equipment can be placed in compartment 19 and a cover 11 can be secured to tray 12 to protect the equipment in tray 12.

Figure 4:
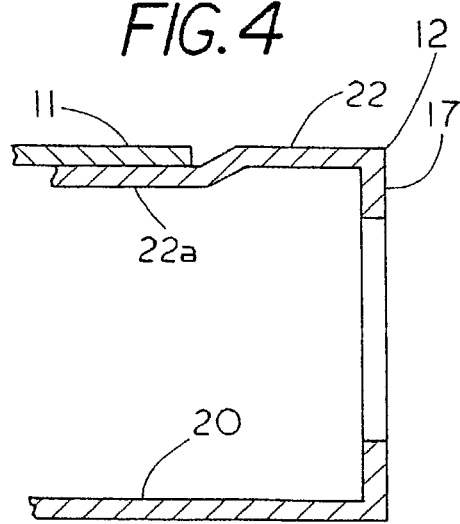
FIG. 4 is a cross sectional view taken along lines 4—4 of FIG. 3 to show the beveled top lip supporting an edge of the cover.

FIG. 4 shows a detail view taken along lines 4—4 of FIG. 3 to show a partial section view of cover 11 and tray 12. In the embodiment shown, bottom section 20 forms a substantial right angle with side 17 and the top flap 22 extends inward generally parallel to bottom section 12. However, flap 22 includes a beveled lip 22a that angles downward from flap 22 to form a recess for receiving the edge of cover 11. This forms a two-fold purpose, first the beveled lip 22a provides stiffness to the tray and second the recess allows one to mount the cover in a flush condition with the top flap 22 if the bevel is sufficient to accommodate the thickness of the cover. As a similar beveled lip is located on rear flap 23 the cover 11 can be flush mounted with both the front and rear of tray 12.

Figure 5:
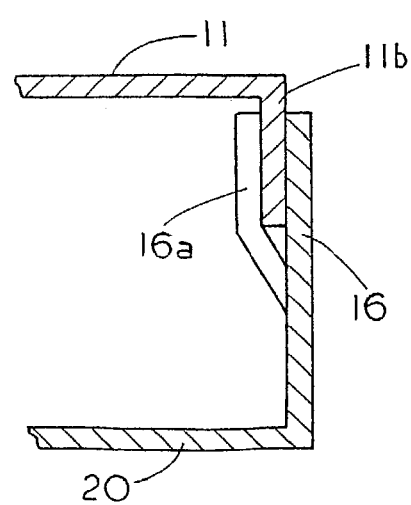
FIG. 5 is a cross sectional view taken along lines 5—5 of FIG. 3 to show the beveled lip and the side coacting to form a cover retaining slot therebetween.

In order to appreciate the cover retaining slots reference should be made to FIG. 5 which shows a partial section view taken along lines 5—5 of FIG. 3. FIG. 5 shows cover 11 in section with lip 11b of cover 11 sandwiched between the straight portion of side 16 and the beveled lip 16a of side 16. A reference to FIG. 2 reveals that the beveled lip 16a is located along a central portion of side 16 and that the sides 16b and 16c which were proximate the ends extended straight upward. As a result the cover lip 11b is restrained on the outside of lip 11b in the regions proximate 16b and 16c and is restrained along inside surface of lip 11b proximate beveled lip 16a. Thus the beveled lip 16a extending along a first portion of side 16 provides stiffness to base 12, with the beveled lip 16a and a second portion 16b and 16c of side 16 coacting to forming a first cover retaining slot therebetween. Similarly, side 18 forms an identically cover retaining slot between beveled lip 18a and second portions 18b and 18c to form a second cover retaining slot therebetween.

Figure 6:
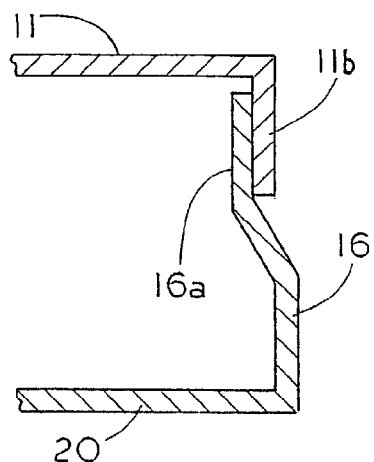
FIG. 6 is a cross sectional view taken along lines 6—6 of FIG. 3 and shows the lip of a cover tray engaging the beveled side lip.

FIG. 6 shows a partial sectional view taken along lines 6—6 of FIG. 3 to show how beveled lip 16a forms face to face contact therewith with the beveled lip 16a allowing one to flush mount cover 11 with the outside face of side 16. In addition the use of beveled lip 16a provides integral stiffening to the tray and inhibits the "oil can effect" occurring with trays made from sheet metal. As a result the coaction of the beveled lip with the folded side adds substantially stiffening to the tray to thereby eliminate the "oil can effect".

Figure 7:
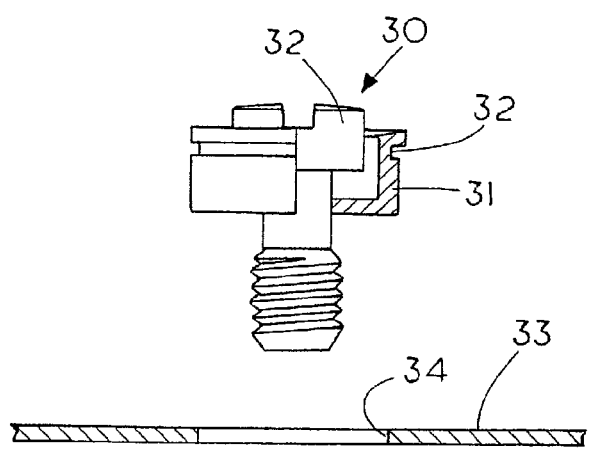
FIG. 7 shows a captive fastener for engaging the equipment tray prior to inserting the captive fastener into the cover.

While different types of fastener can be used to hold the tray FIG. 7 shows a typical captive fastener for use with the present invention. Captive fasteners are characterized in that when in the unengaged condition they are still carried in a ready to use condition and are maintained in a ready to use condition thereby ensuring that the fasteners do not become lost during removal of the cover 11. The captive fastener comprises a screw 32 with a shoulder cap 31 having a circumferential recess 32. The captive screw 32 is shown above an opening 34 in a sheet metal 33 part such as found in cover 11.

Figure 8:
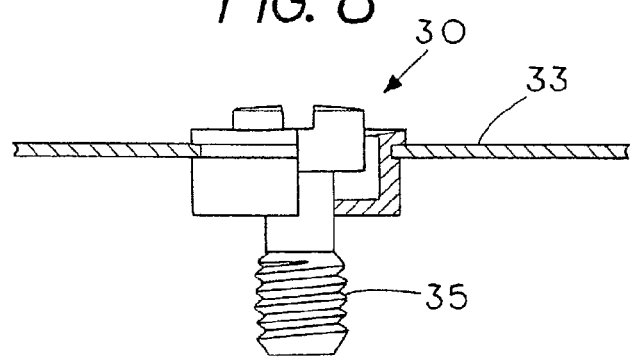
FIG. 8 shows the captive fastener of FIG. 7 in engagement with a portion of the equipment tray.

FIG. 8 illustrates how the captive fastener 30 has been secured in part 33. When secured therein the threads 35 are larger than the opening and prevent the screw 32 from falling out of part 31 while always being in a ready to use condition. Such captive screws are known in the art and are sold under the trademark Southco®. Other fasteners are usable in the present invention, however, to maintain the ease of assembly or disassemble the use of a cover that holds the fasteners in a ready to use condition is preferred.

Figure 9:
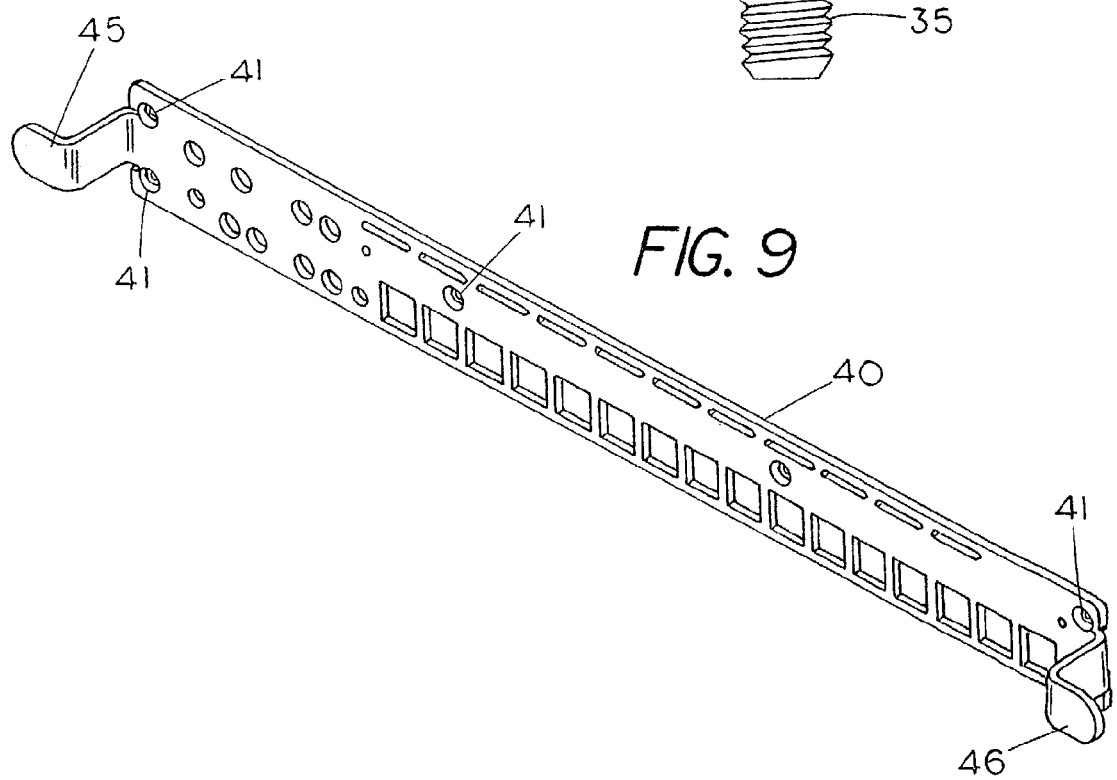
FIG. 9 shows a faceplate with integral ears for securing to the equipment tray to provide access for the contents of the tray as well as a method of removing the tray from an equipment rack.

FIG. 9 shows a faceplate 40 for use with the present invention. Faceplate 40 includes a plurality of openings for switch lights and the like and a plurality of fastener holes 41 for securing the faceplate to front side 17. Located on one end of faceplate 40 is an integral ear 45 and similarly located on the opposite side is a second integral ear 46. Ears 45 and 46 permit an operator to pull a tray free of the rack by inserting one's fingers behind the ears and pulling the tray outward from an equipment rack.

We claim:

1. An equipment tray comprising:
a base, said base having a bottom section and a set of four sides integrally secured to the bottom section, each of said four sides extending outward from said base to form a compartment therein, at least one of said sides having a beveled lip extending lengthwise along an outermost peripheral portion of said side to provide stiffness to said base, said beveled lip and a second portion of said side coacting to forming a first cover retaining slot therebetween.

2. The equipment tray of claim 1 including:
a second side having a beveled lip extending along a first portion of said second side to provide stiffness to said base, said beveled lip of said second side and a second portion of said second side coacting to forming a second cover retaining slot therebetween.

3. The equipment tray of claim 1 including a cover having a top member with an integral cover lip thereon located in said cover retaining slot with said beveled lip and said second portion of said side securing the cover lip therebetween to inhibit vibration or rattling of the cover therein.

4. The equipment tray of claim 1 including a tab on each of said sides with each of said tabs securable to an adjacent side to hold each of the sides in position.

5. The equipment tray of claim 1 wherein at least two sides include an integral top flap secured thereto, said integral top flap extending in a direction generally parallel to said bottom section.

6. The equipment tray of claim 5 wherein the at least two sides include a beveled lip to provide a recess for receiving a cover.

7. The equipment tray of claim 1 wherein the equipment tray is made of sheet metal.

8. The equipment tray of claim 1 wherein each of the sides are secured by a captive fastener.

9. The equipment tray of claim 1 including side brackets.

10. The equipment tray of claim 1 including an opening in at least one of said sides for extending an article therethrough.

11. The equipment tray of claim 1 including a cover, said cover having a lip extending substantially perpendicular therefrom for forming engagement with the base to thereby provide an enclosed compartment.

12. The equipment tray of claim 1 including a faceplate extending along one side of said tray with said faceplate having integral ears for removing said tray from a mounting rack.

* * * * *